United States Patent
Chen et al.

(10) Patent No.: US 11,289,582 B2
(45) Date of Patent: Mar. 29, 2022

(54) SINGLE-CRYSTAL HEXAGONAL BORON NITRIDE LAYER AND METHOD FORMING SAME

(71) Applicant: Taiwan Semiconductor Manufacturing Company, Ltd., Hsinchu (TW)

(72) Inventors: Tse-An Chen, Taoyuan (TW); Chih-Piao Chuu, Hsinchu (TW); Lain-Jong Li, Hsinchu (TW); Wen-Hao Chang, Hsinchu (TW); ChienChih Tseng, New Taipei (TW); Chao-Kai Wen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/594,853

(22) Filed: Oct. 7, 2019

(65) Prior Publication Data
US 2020/0373409 A1   Nov. 26, 2020

Related U.S. Application Data

(60) Provisional application No. 62/852,019, filed on May 23, 2019.

(51) Int. Cl.
*H01L 21/02* (2006.01)
*H01L 29/66* (2006.01)

(52) U.S. Cl.
CPC .... *H01L 29/66469* (2013.01); *H01L 21/0254* (2013.01); *H01L 21/02425* (2013.01); *H01L 21/02568* (2013.01)

(58) Field of Classification Search
None
See application file for complete search history.

(56) References Cited

U.S. PATENT DOCUMENTS

| 8,790,775 | B2 | 7/2014 | Kim et al. |
| 9,219,111 | B2 | 12/2015 | Kobayashi et al. |
| 2006/0203398 | A1* | 9/2006 | Ishizone ............. G11B 5/3903 360/324.12 |
| 2011/0045282 | A1 | 2/2011 | Kelber |
| 2011/0256386 | A1* | 10/2011 | Shi ..................... C30B 33/02 428/336 |

(Continued)

FOREIGN PATENT DOCUMENTS

| KR | 20130063410 A | 6/2013 |
| KR | 20140043460 A | 4/2014 |

(Continued)

OTHER PUBLICATIONS

"Deposit." Merriam-Webster, Merriam-Webster, Jul. 5, 2021, www.merriam-webster.com/dictionary/deposit. (Year: 2021).*

(Continued)

*Primary Examiner* — Jay C Chang
(74) *Attorney, Agent, or Firm* — Slater Matsil, LLP (57) ABSTRACT

A method includes depositing a copper layer over a first substrate, annealing the copper layer, depositing a hexagonal boron nitride (hBN) film on the copper layer, and removing the hBN film from the copper layer. The hBN film may be transferred to a second substrate.

20 Claims, 8 Drawing Sheets

(56) References Cited

U.S. PATENT DOCUMENTS

2015/0181232 A1* 6/2015 Takahashi .............. H04N 19/52
                                                    375/240.16
2017/0170260 A1   6/2017 Dresselhaus et al.
2018/0197736 A1* 7/2018 Kim .................. H01L 21/02444
2020/0109487 A1* 4/2020 Kim .................. H01L 21/02658

FOREIGN PATENT DOCUMENTS

| KR | 20160036012 A | 4/2016 |
| KR | 101692514 B1 | 1/2017 |
| KR | 20170100984 A | 9/2017 |
| KR | 20180004551 A | 1/2018 |
| WO | 2014182540 A1 | 11/2014 |

OTHER PUBLICATIONS

Lee, Joo Song, et al., "Wafer-scale single-crystal hexagonal boron nitride film via self-collimated grain formation," Science 362, 817-821, Nov. 16, 2018, 5 pages.

* cited by examiner

SINGLE-CRYSTAL HEXAGONAL BORON NITRIDE LAYER AND METHOD FORMING SAME

PRIORITY CLAIM AND CROSS-REFERENCE

This application claims the benefit of the filed U.S. Patent Provisional Application No. 62/852,019, filed May 23, 2019, and entitled "Single-crystal wafer-scale hexagonal boron nitride monolayers grown on Cu(111) thin films;" which application is hereby incorporated herein by reference.

BACKGROUND

In recent development of integrated circuits, two dimensional (2D) semiconductor electronic devices were studied. A 2D transistor may include a 2D channel, which includes a channel having the thickness in atomic scale, with the channel formed between two insulator layers. The implementation of 2D transistors on physical wafers, however, runs into problems. For example, in previous research effort, the use of hexagonal boron nitride (hBN) films was studied to use as the insulators. The previous hBN films, however, were polycrystalline, which results in the degradation in the performance of the 2D transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A hexagonal Boron Nitride (hBN) film and the method of forming the same are provided in accordance with some embodiments. A method of forming a transistor based on the hBN film and the corresponding device are provided. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order. In accordance with some embodiments of the present disclosure, a copper (Cu) film (layer) having a (111) surface orientation is formed on a sapphire substrate. The copper film, as deposited, may be a polycrystalline film. The polycrystalline Cu film is annealed to convert the polycrystalline structure into a single-crystalline structure. A single-crystalline hBN film is then grown on the single-crystalline copper film. The single-crystalline hBN film may be transferred to a substrate, and a Transition Metal Dichalcogenide (TMD) layer may be formed or transferred on the hBN film. A transistor may be formed based on the TMD layer and the hBN film.

Figure 1:
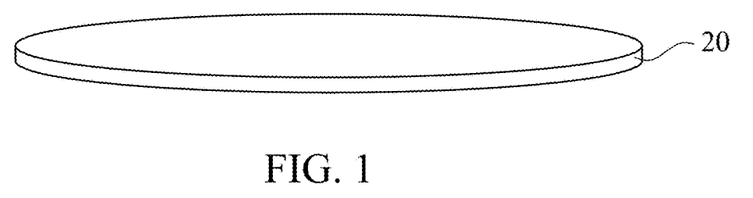
FIGS. 1 through 3 illustrate the perspective views of intermediate stages in the formation of a hexagonal boron nitride (hBN) film in accordance with some embodiments.
Figure 2:
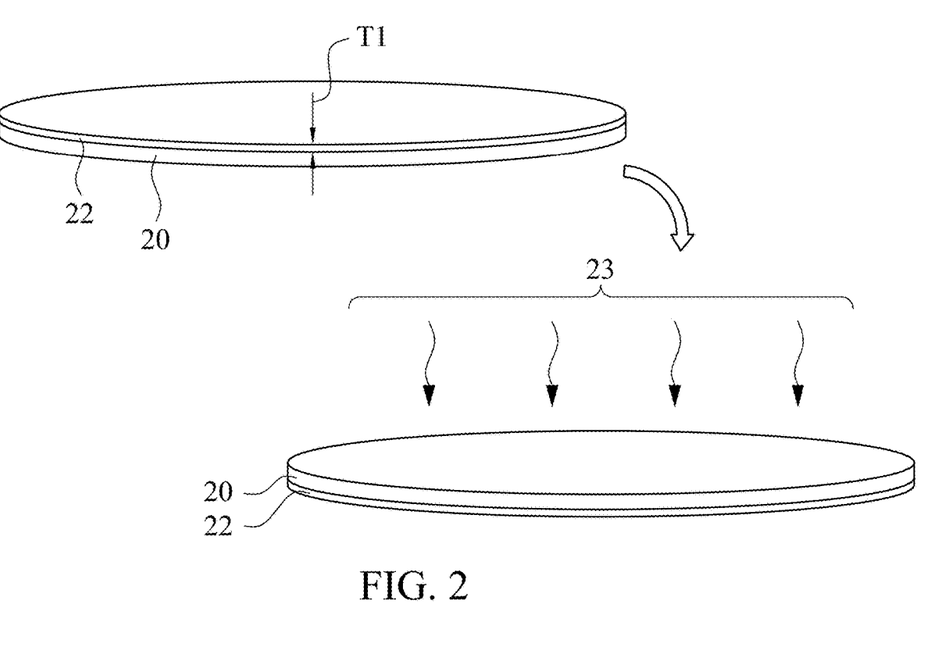
Figure 3:
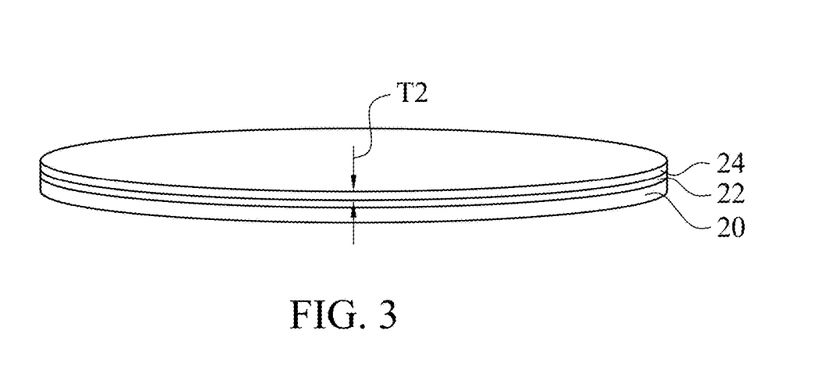
Figure 18:
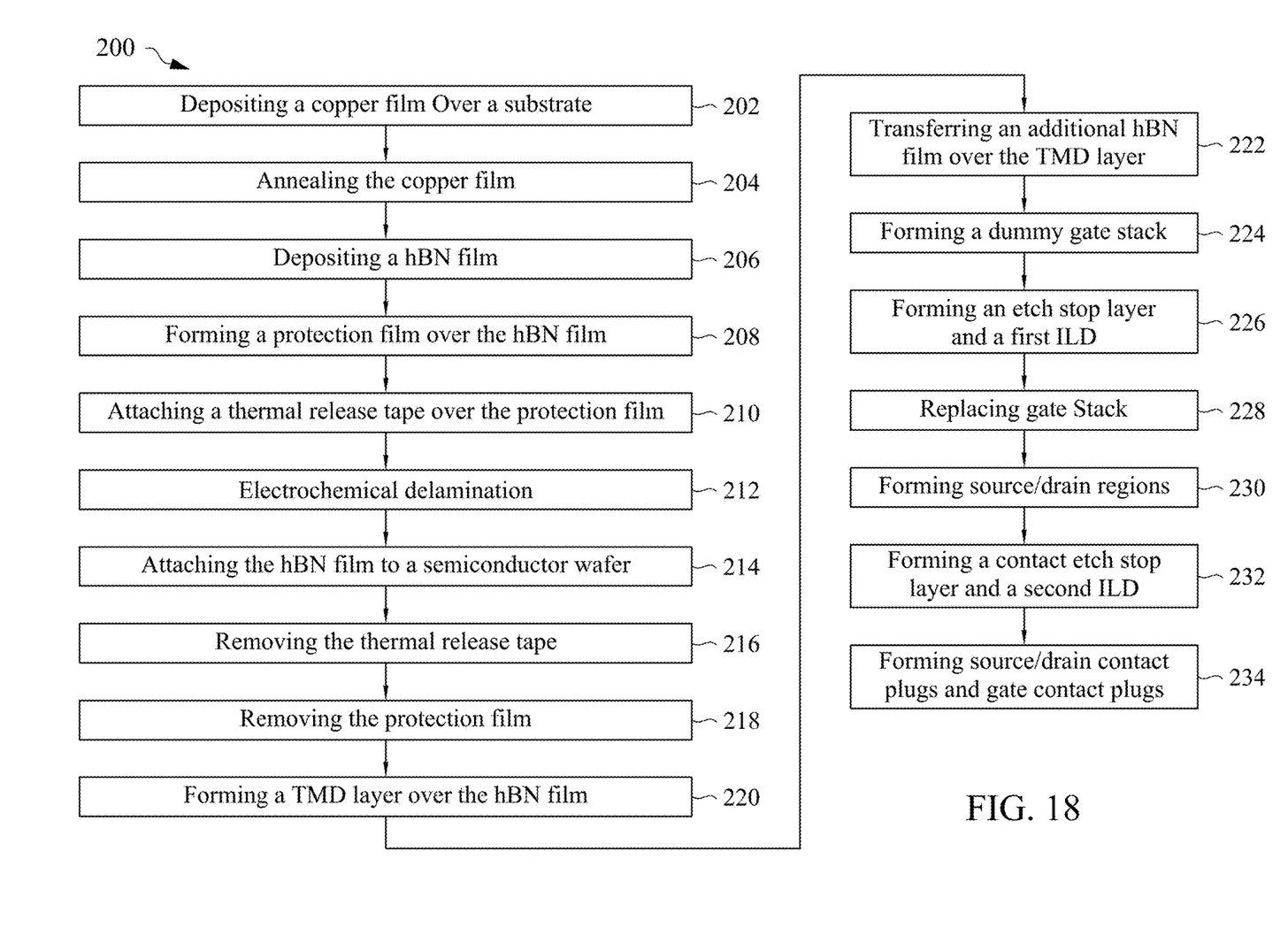
FIG. 18 illustrates a process flow for forming an hBN film and a transistor based on the hBN film in accordance with some embodiments.

FIGS. 1 through 3 illustrate the perspective views of intermediate stages in the formation of an hBN film in accordance with some embodiments of the present disclosure. The corresponding processes are also reflected schematically in the process flow 200 shown in FIG. 18.

Referring to FIG. 1, substrate 20 is provided. In accordance with some embodiments of the present disclosure, substrate 20 comprises or is a sapphire substrate. The sapphire substrate 20 may be a c-plane sapphire substrate (sometimes referred to as a c-sapphire) substrate. In accordance with alternative embodiments, the substrates with other planes (such as M plane, R plane, or A plane) may be adopted. Substrate 20 may be in the form of a wafer, and may have a round top-view shape or a rectangular top-view shape. The diameter of substrate 20 may be 3 inch, 12 inch, or greater. The sapphire substrate 20 is a single-crystalline substrate in accordance with some embodiments of the present disclosure.

Referring to FIG. 2, copper film 22 is deposited on substrate 20. The respective process is illustrated as process 202 in the process flow shown in FIG. 18. In accordance with some embodiments, the deposition is achieved through sputter or like methods. During the deposition, argon may be used as the process/sputter gas. The pressure of the process gas may be in a range between about 0.05 mTorr and about 3 mTorr. The resulting copper film 22 preferably has a good crystalline structure. Accordingly, the deposition rate is controlled to be not too high in order to achieve a good crystalline structure. Otherwise, amorphous structure may be formed. On the other hand, since the deposition is performed at a high temperature, the deposited copper may evaporate. If the deposition rate is too low, the evaporation rate may exceed the deposition rate, and the copper layer, instead of having thickness increased with the proceeding of deposition, may adversely have net reduction in the thickness. In accordance with some embodiments, the deposition rate is selected to be lower than about 5 nm, and may be in the range between about 0.05 nm and about 5 nm. Furthermore, the thickness T1 of copper film 22 is controlled to be within certain range. It is appreciated that with the increase in thickness T1 of copper film 22, more grains tend to be generated in copper film 22, which means that the grain sizes become increasingly smaller, and hence the quality of the newly grown upper portions of copper film 22 is degraded compared to the lower portions of copper film 22. On the other hand, if copper film 22 is too thin, in subsequent high-temperature processes such as the annealing process, the evaporation of copper film 22 may cause copper film 22 to be too thin. In accordance with some embodiments, the thickness T1 is selected to be in the range between about 400 nm and about 600 nm.

The deposition of copper film 22 may be performed by sputtering copper from a copper target, with argon being used. Also, hydrogen ($H_2$) may be added as a process gas during the deposition of copper film 22. The adding of hydrogen may prevent the undesirable oxidation of copper film 22. During the deposition, the pressure of the process gas may be in the range between about 1 Torr and about 500 Torr. The temperature of substrate 20 is selected to be in a certain range. Experiment results indicated that when temperature is too low, copper film 22 may not have crystalline structure or the quality of crystalline structure of copper film 22 is too low. Alternatively stated, the grain sizes of copper film 22 may become too small or copper film 22 may become amorphous if the deposition temperature is too low. For example, when the temperature is lower than 900° C., the orientation of the crystalline structure in neighboring grains may be rotated relative to each other (by 60 degrees), and thus have different orientations. Boundaries are accordingly generated between the neighboring grains. On the other hand, if the growth temperature is too high (such as higher than about 1,100° C.), copper film 22 may evaporate at the same time it is deposited. Also, too-high temperature also destructs the crystalline structure, for example, causing at least the partial melting of copper film 22. Accordingly, the temperature of substrate 20 is selected to be in the range between about 900° C. and about 1,100° C.

The copper film 22 may have a polycrystalline structure as deposited. An annealing process (represented by arrows 23) is then performed to convert the polycrystalline structure of copper film 22 into a single-crystalline structure. The respective process is illustrated as process 204 in the process flow shown in FIG. 18. In accordance with some embodiments, the annealing process is performed in a chamber with hydrogen ($H_2$) as a process gas. The use of hydrogen as the annealing gas may reduce any oxidized part of copper film 22 back into elemental copper, and may prevent the oxidation of copper film 22. The annealing temperature may be in the range between about 500° C. and about 1,100° C. Experiment results also indicated that when the annealing temperature is too low (such as lower than about 500° C.), the effect of the structure conversion is not satisfactory, or the annealing may take too long to fully convert the polycrystalline structure into the single-crystalline structure.

On the other hand, if the annealing temperature is too high (such as higher than about 1,100° C.), copper film 22 may evaporate with the proceeding of the annealing process. Also, too-high temperature causes the destruction of the crystalline structure, for example, causing at least the partial melting of copper film 22.

As aforementioned, to effectively convert the polycrystalline copper film 22 into single-crystal, the annealing temperature is preferably high (but not excessively high). This may cause the evaporation of copper and the reduction in the thickness of copper film 22. To reduce the evaporation, the copper film 22 is placed facing down during the annealing (as shown in FIG. 2), which means substrate 20 is over copper film 22 during the annealing. This allows the annealing temperature to be increased while still keep the evaporation rate on check. Furthermore, the increase in the chamber pressure may also reduce the evaporation. In accordance with some embodiments of the present disclosure, during the annealing process, the pressure of the process gas is in the range between about 760 Torr and about 0.1 Torr. The annealing duration may be in the range between about 10 minutes and about 480 minutes.

After the annealing process, copper film 22 may have a single-crystalline film. The surface orientation of copper film 22 may be in (111) direction. Throughout the description, the copper film having the (111) surface orientation is alternatively referred to as a Cu (111) film. It is appreciated that the copper film 22 with the (111) surface orientation has a low surface energy, and hence it is relatively easy to form a single-crystalline Cu (111) film. Also, the lattice constant of Cu (111) film is close to the lattice constant of the subsequently formed hBN film, and hence the hBN film grown on Cu (111) film may have fewer faults. Accordingly, the material of substrate 20, the surface orientation of substrate 20, and the process conditions for forming copper film 22 are selected, so that (111) surface orientation may be generated in the subsequently formed hBN film.

Referring to FIG. 3, an hBN film 24 is deposited. The respective process is illustrated as process 206 in the process flow shown in FIG. 18. The hBN film 24 has a honeycomb structure. In accordance with some embodiments of the present disclosure, hBN film 24 is deposited using a deposition method such as Chemical Vapor Deposition (CVD), Low-Pressure Chemical Vapor Deposition (LPCVD), or the like. The process gases (precursors) may include hydrogen ($H_2$) and another precursor such as ammonia borane ($BH_3N$), Borazine ($B_3H_6N_3$), and/or the like. During the deposition, the temperature of substrate 20 may be in the range between about 900° C. and about 1,080° C. The temperature of the precursors may be in the range between about 60° C. and about 130° C. The deposition time may be in the range between about 5 minutes and about 180 minutes.

In accordance with some embodiments, during the deposition of hBN film 24, the exposed copper atoms of copper film 22 act as a catalyst to activate the $BH_3N$ molecules, so that it may enable a boron nitride mono layer to be grown on copper film 22. When a portion of the exposed copper film 22 is covered with the boron nitride mono layer, since there are no exposed copper atoms acting as the catalyst, it is difficult for more boron nitride to be deposited on the already deposited boron nitride mono layer. Accordingly, a mono layer of hBN film 24 may be deposited, and the deposition may be self-stopping. In accordance with some embodiments, the thickness T2 of the mono-layer hBN film 24 is in the range between about 3 Å and about 10 Å. In accordance with alternative embodiments when different deposition methods and/or process conditions are used, hBN film 24 may continue to grow in thickness. For example, increasing the pressure in the corresponding process chamber may enable hBN film 24 to grow over time while still keep the single-crystalline structure. As a result, in accordance with some embodiments, hBN film 24 may include a plurality of hBN mono layers, and the thickness T2 may be in the range between about 10 Å and about 200 Å.

Since hBN film 24 is grown on the single-crystalline copper film 22, with appropriate process conditions for the deposition, hBN film 24 may be formed to have a single-crystalline structure, as deposited. A single-crystalline hBN film 24 is advantageous for the formation of devices such as transistors. For example, if hBN film 24 or hBN film 50 (FIG. 16) in transistor 77 have polycrystalline structure, when carriers (such as electrons) flow in the channel material 44 between hBN film 24 and hBN film 50, carrier scattering occurs at the boundary of the grains of the polycrystalline structure of hBN film 24 and hBN film 50, causing the degradation of the performance of the resulting transistor. Accordingly, having a single-crystalline structure is beneficial for the resulting devices formed based on the hBN film 24.

Figure 4:
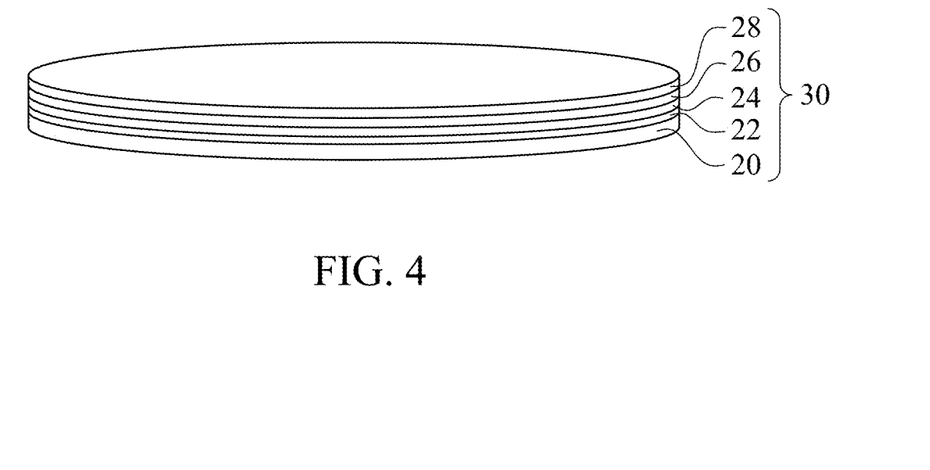
FIGS. 4 through 8 illustrate the perspective views of intermediate stages in the transferring of an hBN film in accordance with some embodiments.

After the formation of hBN film 24, hBN film 24 may be transferred onto a wafer, and may be used in the formation of integrated circuits such as transistors. The corresponding transfer process is illustrated in FIGS. 4 through 8. The respective processes are also shown in the process flow shown in FIG. 18. FIG. 4 illustrates the preparation for transferring hBN film 24 onto a wafer. Referring to FIG. 4, a protection film 26 is formed on hBN film 24. Protection film 26 has the function of protecting hBN film 24 from the damage during the transfer process. The respective process is illustrated as process 208 in the process flow shown in FIG. 18. In accordance with some embodiments, protection film 26 comprises polymethyl methacrylate (PMMA), which is in a flowable form, and is coated on hBN film 24, for example, using spin coating. The coated PMMA film 26 is cured and solidified. In accordance with alternative embodiments, other types of flowable and curable material or dry film that may provide protection may also be used. Thermal release tape 28 is then covered on PMMA film 26. The respective process is illustrated as process 210 in the process flow shown in FIG. 18. Thermal release tape 28 may be formed of a material that may lose adhesion under a thermal condition or other conditions (such as radiation). Throughout the description, the structure including substrate 20, copper film 22, hBN film 24, PMMA film 26, and thermal release tape 28 is referred to as composite wafer 30.

Figure 5:
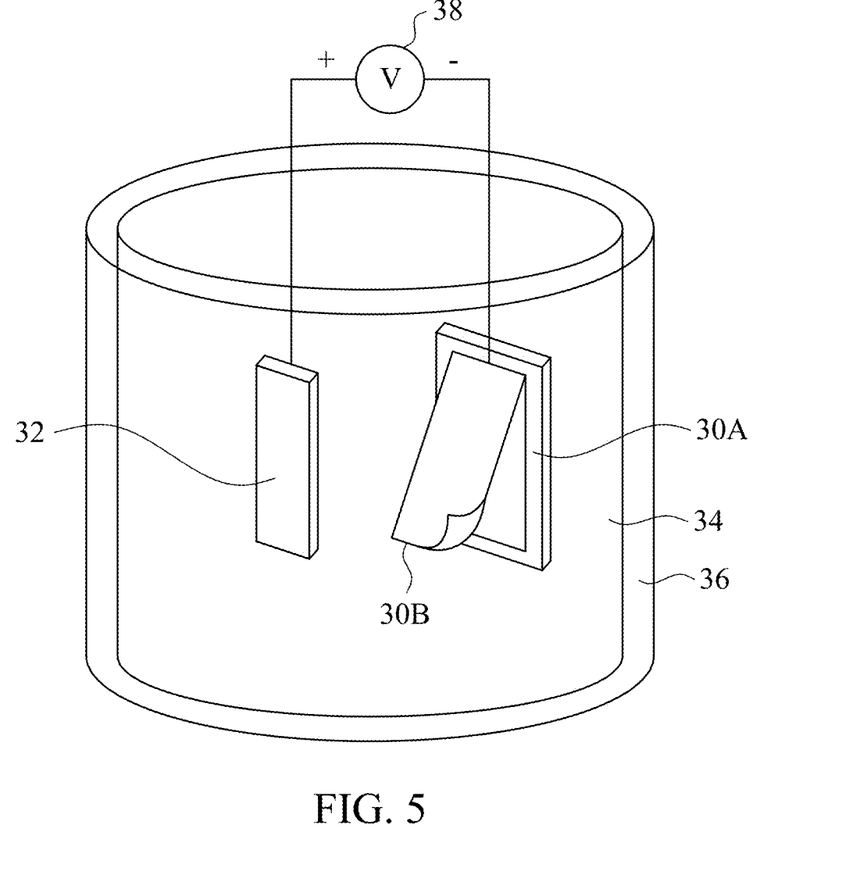

Next, as shown in FIG. 5, an electrochemical delamination process is performed to separate copper film 22 from hBN film 24. The respective process is illustrated as process 212 in the process flow shown in FIG. 18. The electrochemical delamination process is performed by placing composite wafer 30 into electrochemical solution 34, which is contained in container 36. In accordance with some embodiments, electrochemical solution 34 comprises the aqueous solution of NaOH as the electrolyte, or may comprise the aqueous solution of other types of chemicals such as $K_2SO_4$ Tetramethyl ammonium Hydroxide (TMAH), or the like. The concentration of NaOH in electrochemical solution 34 may be in the range between about 0.2 mol/L and about 5 mol/L. In accordance with some embodiments, a metal plate 32 is used as the anode, and the composite wafer 30 is used as the cathode. In accordance with some embodiments of the present disclosure, metal plate 32 (the anode) may be formed of or comprise platinum or another type of metal. The anode and the cathode are connected to a positive end and a negative end, respectively, of voltage source 38. The negative end of voltage source 38 is electrically connected to copper film 22 in composite wafer 30.

During the electrochemical delamination process, the electrochemical delamination solution 34 permeates from the edges of composite wafer 30 toward center, and hydrogen gas bubbles are generated from the water in the permeated electrochemical delamination solution 34. Furthermore, the hydrogen gas bubbles are generated between copper film 22 and hBN film 24. Accordingly, copper film 22 is separated from hBN film 24. The duration of the electrochemical delamination process is related to various factors including the sizes of composite wafer 30, the applied voltage, and the like. For example, increasing the voltage V may increase the separation rate. However, a too-high voltage V may results in defects to be generated such as the delamination of hBN film 24 from protection layer 26, and hence causing the damage of hBN film 24. If the voltage is too low, on the other hand, the separation rate is too low, and also the composite wafer 30 is exposed to the electrochemical delamination solution 34 for an extensive period of time, also resulting in the damage of the layers such as hBN film 24 in composite wafer 30. In accordance with some embodiments, the voltage V is in the range between about 1 V and about 10 V, and may also be in the range between about 3 V and about 5 V.

Figure 6:
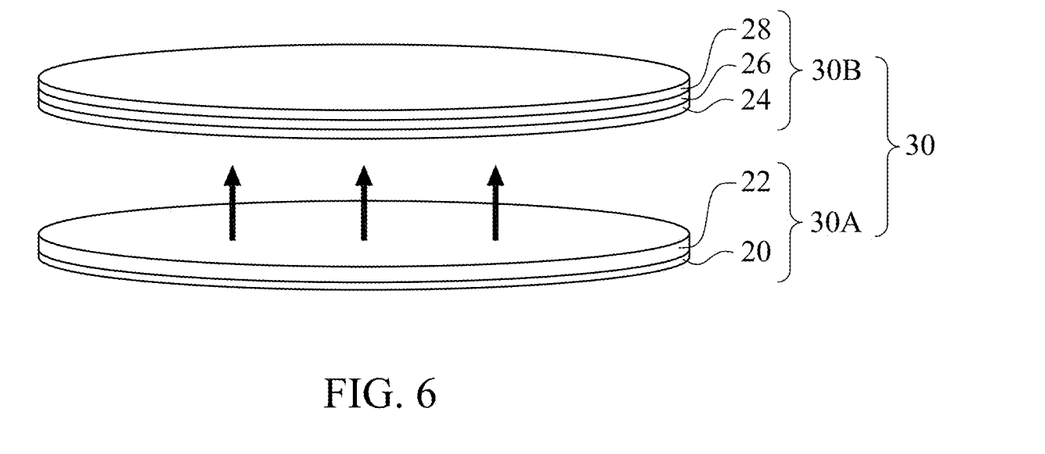

The electrochemical delamination process as shown in FIG. 5 results in the separation of composite wafer 30 into two wafer parts 30A and 30B as shown in FIGS. 5 and 6. The wafer part 30A includes substrate 20 and copper film 24, and the wafer part 30B includes hBN film 24, protection layer 26, and thermal release tape 28. At this stage, since both of hBN film 24 and protection layer 26 are thin, thermal release tape 28 has the function of preventing wafer part 30B from folding. Substrate 20, which is in wafer part 30A, is undamaged. Accordingly, substrate 20 may be reused, for example, by removing copper film 22 through etching. The resulting substrate 20 may be reused to perform the processes as shown in FIGS. 2 through 6.

Figure 7:
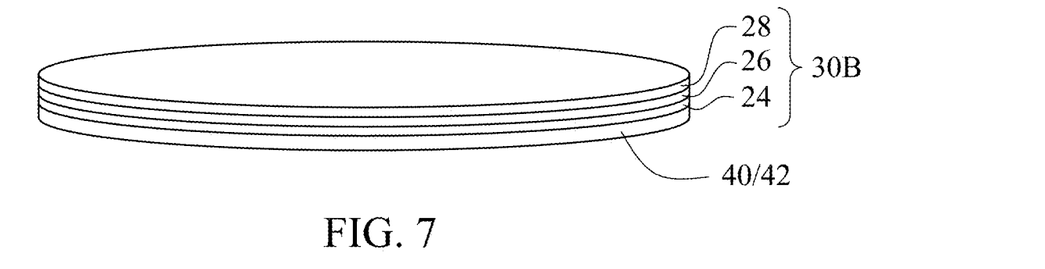

Referring to FIG. 7, wafer part 30B is adhered to substrate 40. Substrate 40 may be in wafer 42, which includes substrate 40, and may or may not include other layers. The respective process is illustrated as process 214 in the process flow shown in FIG. 18. In accordance with some embodiments, hBN film 24 is in physical contact with, and hence is adhered to, the substrate 40 in wafer 42. In accordance with alternative embodiments, hBN film 24 is in physical contact with a surface material of substrate 40, wherein the surface material may be, for example, a semiconductor material such as silicon, a dielectric material such as silicon oxide, silicon nitride, or the like. Substrate 40 may be a semiconductor substrate, such as a bulk semiconductor substrate, a Semiconductor-On-Insulator (SOI) substrate, or the like, which may be doped (e.g., with a p-type or an n-type dopant) or undoped. In accordance with some embodiments, the semiconductor material of semiconductor substrate 40 may include silicon, germanium, or a compound semiconductor including silicon carbide, gallium arsenic, gallium phosphide, indium phosphide, indium arsenide, and/or indium antimonide. Semiconductor substrate 40 may also be formed of or comprise an alloy semiconductor including SiGe, GaAsP, AlInAs, AlGaAs, GaInAs, GaInP, and/or GaInAsP; or combinations thereof.

In subsequent processes, thermal release tape 28 and protection layer 26 are removed. The respective process is illustrated as processes 216 and 218 in the process flow shown in FIG. 18. In accordance with some embodiments of the present disclosure, thermal release tape 28 is removed by baking the structure shown in FIG. 7, for example, at a temperature in the range between about 160° C. and about 200° C., so that thermal release tape 28 loses adhesiveness, and hence may be removed from protection layer 26. The baking may be performed by placing the structure as shown in FIG. 7 on a hot plate (not shown). Next, the protection layer 26 is removed, for example through etching or dissolving. In accordance with some embodiments in which protection layer 26 is formed of PMMA, protection layer 26 is removed by immersing the structure in hot acetone, for example, for a period of time in the range between about 30 minutes and about 50 minutes. The temperature of the hot acetone may be in the range between about 30° C. and about 100° C.

Figure 8:
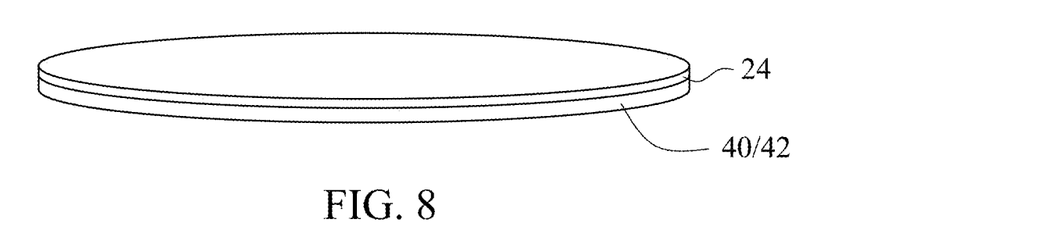

After the removal of protection layer 26, hBN film 24 is exposed, as shown in FIG. 8. It is appreciated that hBN film 24 is a crystalline film, regardless of the material and the lattice structure of the underlying material such as substrate 40. This is advantageous over growing an hBN film on substrate 40 or other surface layer of wafer 42 because it is impossible to grow a single-crystalline hBN film from wafer 42. This is due to various limitations such as whether the underlying layer from which the hBN film is grown is single-crystalline or not, whether the lattice constants of the hBN film and the underlying layer match with each other, and the like.

Figure 9:
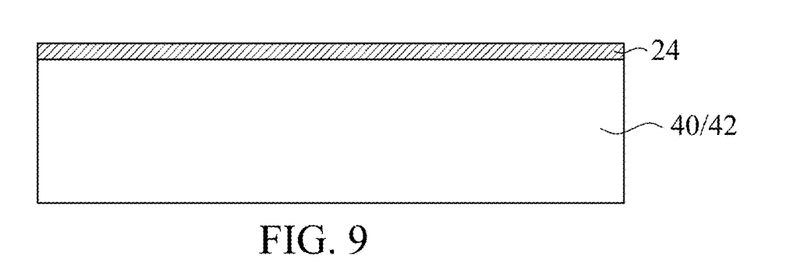
FIGS. 9 through 16 illustrate the cross-sectional views of intermediate stages in the formation of a transistor based on an hBN film in accordance with some embodiments.

FIGS. 9 through 16 illustrate the cross-sectional view of intermediate stage in the formation of a 2D device, which is a transistor in accordance with some embodiments. The respective processes are also shown in the process flow shown in FIG. 18. FIG. 9 illustrates a cross-sectional view of the structure shown in FIG. 8, which structure includes hBN film 24 and substrate 40.

Figure 10:
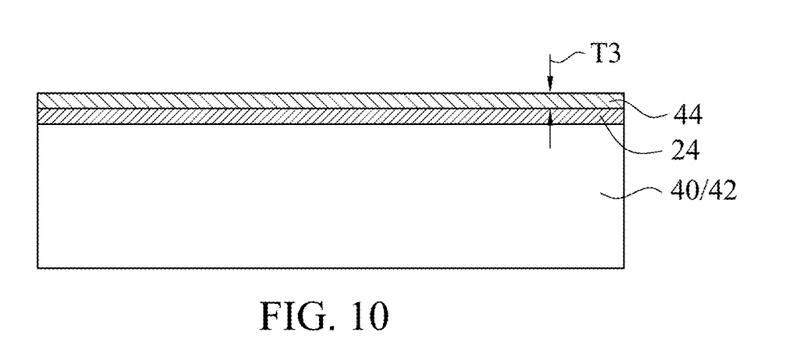

Referring to FIG. 10, TMD layer 44 is transferred onto or formed on hBN film 24. The respective process is illustrated as process 220 in the process flow shown in FIG. 18. In accordance with some embodiments of the present disclosure, TMD layer 44 comprises the compound of a transition metal and a group-VIA element. The transition metal may include tungsten (W), molybdenum (Mo), Ti, or the like. The group-VIA element may be sulfur (S), selenium (Se), tellurium (Te), or the like. For example, TMD layer 44 may include $MoS_2$, $MoSe_2$, $WS_2$, $WSe_2$, or the like.

Figure 17:
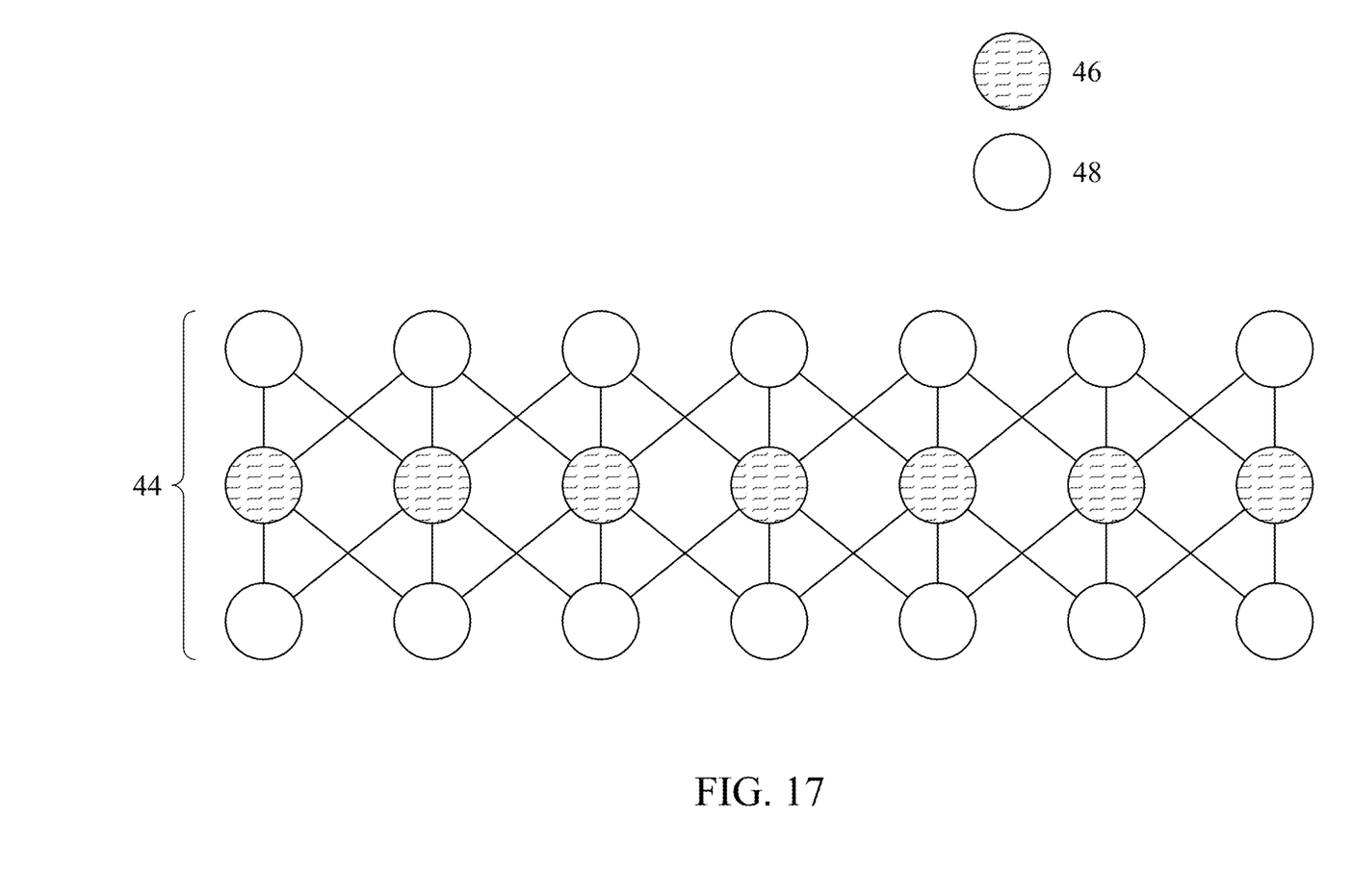
FIG. 17 schematically illustrates a mono-layer of a Transition Metal Dichalcogenide (TMD) in accordance with some embodiments.

TMD layer 44 may be a mono-layer or may include a few mono-layers. FIG. 17 illustrates a schematic view of a mono-layer of an example TMD in accordance with some example embodiments. In FIG. 17, the transition metal atoms 46 form a layer in the middle, the group-VIA atoms 48 form a first layer over the layer of atoms 46, and a second layer underlying the layer of atoms 46. Atoms 46 may be W atoms, Mo atoms, or Ti atoms, and atoms 48 may be S atoms, Se atoms, or Te atoms in accordance with some embodiments. In the illustrated example embodiments, each of atoms 46 is bonded to four atoms 48, and each of atoms 48 is bonded to two atoms 46. Throughout the description, the illustrated cross-bonded layers including one layer of atoms 46 and two layers of atoms 48 in combination are referred to as a mono-layer of TMD.

Referring back to FIG. 10, in accordance with some embodiments of the present disclosure, TMD layer 44 has a single-crystalline structure with a single mono-layer (FIG. 17). In accordance with alternative embodiments of the present disclosure, TMD layer 44 includes several mono-layers (such as two to five layers), and hence is referred to as having a multi-layer structure. In the multi-layer structure, there are several mono-layers (FIG. 17) stacked. In accordance with some embodiments, the total count of the mono-layers in the multi-layer is small in order to improve the gate control of the resulting transistor, wherein the gate control reflects the ability of the gate(s) controlling the channel of the resulting transistor. The total count of the mono-layers in the multi-layer may be smaller than about 5 in some example embodiments. In accordance with alternative embodiments of the present disclosure, the total count may be greater than 5. Thickness T3 of TMD layer 44 may be in the range between about 0.5 nm and about 5 nm in accordance with some example embodiments.

TMD layer 44 may be deposited using CVD, with $MoO_3$ and S as process gases and $N_2$ as a carrier gas. In accordance with alternative embodiments, Plasma-Enhanced Chemical Vapor Deposition (PECVD) or another applicable method is used. The formation temperature may be in the range between about 600° C. and about 700° C. in accordance with some example embodiments, and higher or lower temperatures may be used. The process conditions are controlled to achieve the desirable total count of mono-layers. In accordance with alternative embodiments, TMD layer 44 is formed on another substrate, and is then transferred onto hBN film 24.

Figure 11:
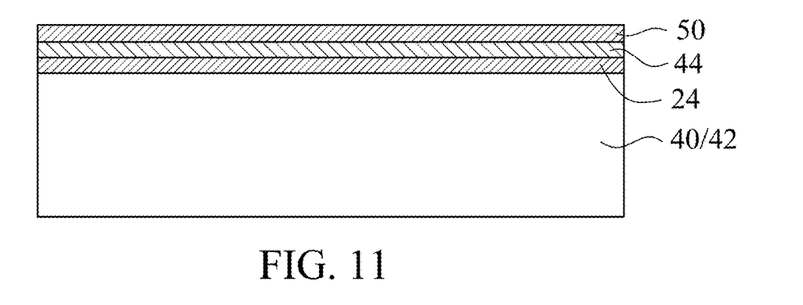

FIG. 11 illustrates the transferring of another hBN film 50 over TMD layer 44. The respective process is illustrated as process 222 in the process flow shown in FIG. 18. HBN film 50 may be in physical contact with TMD layer 44 in accordance with some embodiments. HBN film 50 may be formed using essentially the same processes as shown in FIGS. 1 through 3, and hence the materials and the properties of hBN film 50 may be essentially the same as that of hBN film 24. HBN film 50 may also be a single-crystalline layer, and may be a mono layer. Alternatively, hBN film 50 may include a plurality of boron nitride mono layers. After the formation of hBN film 50 using the processes shown in FIGS. 1 through 3, the processes as shown in FIGS. 4 through 8 are performed to transfer hBN film 50 onto TMD layer 44.

In subsequent processes, hBN film 50, TMD layer 44, and possibly hBN film 24 are patterned, and the patterned portions are used for the formation of 2D transistors. It is assumed that the hBN film 50, TMD layer 44, and possibly hBN film 24 as illustrated in subsequent figures represent the remaining patterned portions. In the example formation process of a 2D transistor as discussed subsequently, a gate-last process is used as an example, in which the (replacement) gate stack is formed after the formation of inter-layer dielectric. It is appreciated that a gate-first process may also be adopted, in which a gate stack of the transistor is formed before the formation of inter-layer dielectric.

Figure 12:
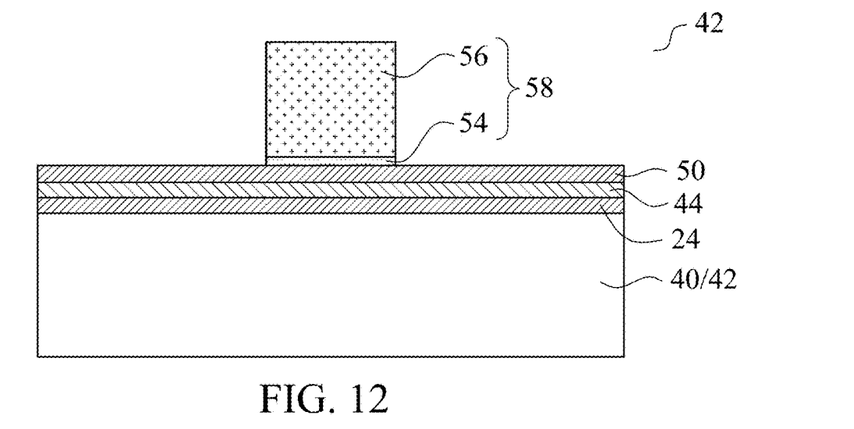

FIG. 12 illustrates the formation of gate stack 58. The respective process is illustrated as process 224 in the process flow shown in FIG. 18. Gate stack 58 may include gate dielectric 54 and gate electrode 56 over gate dielectric 54. In accordance with some embodiments, gate stack 58 is a dummy gate stack, which is replaced with a replacement gate stack in subsequent processes. In accordance with some embodiments, the corresponding gate dielectric 54 may be formed of or comprise silicon oxide, and the corresponding gate electrode 56 may be formed of or comprise polysilicon. In accordance with alternative embodiments in which gate stack 58 is not dummy, and acts as the gate stack 58 of the final 2D transistor, the corresponding gate dielectric 54 may be formed of or comprise silicon oxide and a high-k dielectric layer, and the corresponding gate electrode 56 may be formed of or comprise polysilicon, a metal, or a metal compound. The formation of the corresponding gate stack 58 includes depositing the corresponding layers, and then performing a patterning process on the deposited layers. The patterning may be performed without patterning hBN film 50, so that hBN film 50 may be used as a capping layer protecting the underlying TMD layer 44 from the damage incurred in the various processes involved, such as cleaning processes.

Figure 13:
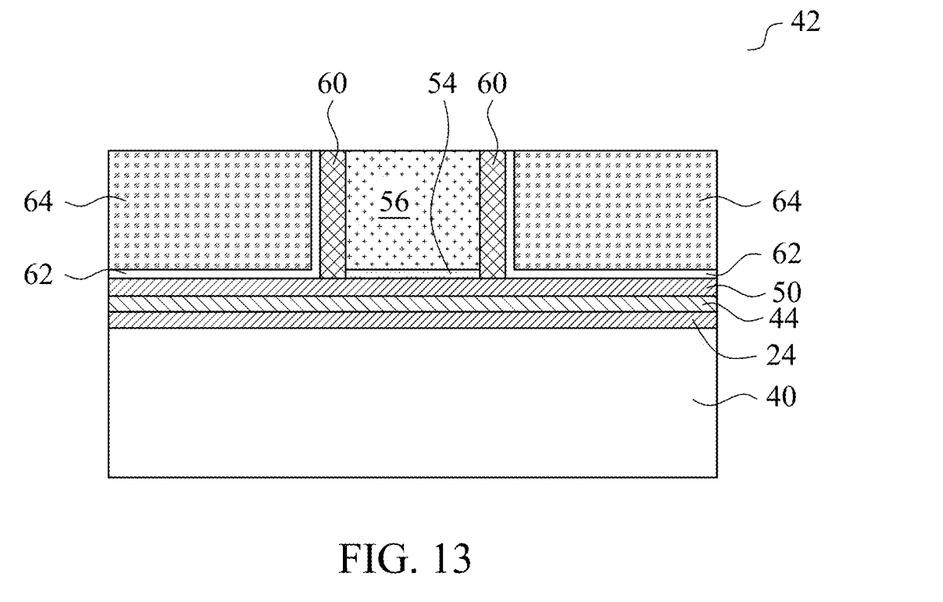

FIG. 13 illustrates the formation of gate spacers 60, Etch Stop Layer (ESL) 62, and Inter-Layer Dielectric (ILD) 64 over ESL 62. The respective process is illustrated as process 226 in the process flow shown in FIG. 18. Gate spacers 60 may be formed of silicon oxide, silicon nitride, silicon oxynitride, composite layers thereof, and/or combinations thereof. ESL 62 may be formed of or comprise silicon carbide, silicon nitride, silicon oxynitride, silicon carbonitride, or multi-layers thereof. Furthermore, in accordance with some embodiments, ILD 64 comprises silicon oxide, phospho silicate glass (PSG), borosilicate glass (BSG), boron-doped phospho silicate glass (BPSG), fluorine-doped silicate glass (FSG), or the like. ILD 64 may be formed using spin coating, Flowable Chemical Vapor Deposition (FCVD), or the like. In accordance with alternative embodiments of the present disclosure, ILD 64 is formed using a deposition method such as PECVD, Low Pressure Chemical Vapor Deposition (LPCVD), or the like.

Figure 14:
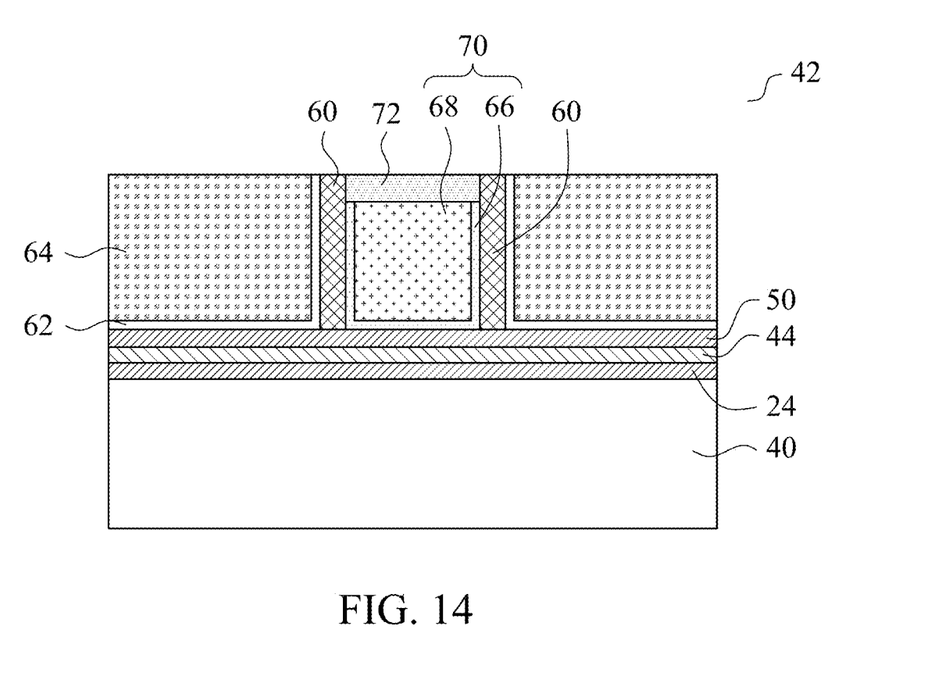

FIG. 14 illustrates the process for replacing gate stack 58 (if it is a dummy gate stack) in FIG. 13 with replacement gate 70. The respective process is illustrated as process 228 in the process flow shown in FIG. 18. The process includes performing etching processes to remove dummy gate stack 58 in FIG. 13, depositing a conformal gate dielectric layer extending into the trench left by the removed dummy gate stack 58, depositing one or a plurality of conductive layers on the conformal gate dielectric layer, and performing a planarization process to remove excess portions of the conformal gate dielectric layer and the conductive layers. The resulting gate dielectric 66 may comprise a high-k dielectric material selected from $HfO_2$, $HfSiO_x$, $HfZrO_x$, $Al_2O_3$, $TiO_2$, $LaO_x$, $BaSrTiO_x$ (BST), $PbZr_xTi_yO_z$ (PZT), multi-layers thereof, and/or combinations thereof. The resulting gate electrode 68 may comprise a metal such as nickel (Ni), palladium (Pd), scandium (Sc), titanium (Ti), or alloys thereof. The formation methods of gate dielectric 66 and gate electrode may include CVD, PECVD, ALD, and the like. In accordance with some embodiments, replacement gate 70 is recessed to form dielectric hard mask 72, which is planarized, so that its top surface may be coplanar with the top surface of ILD 64.

Figure 15:
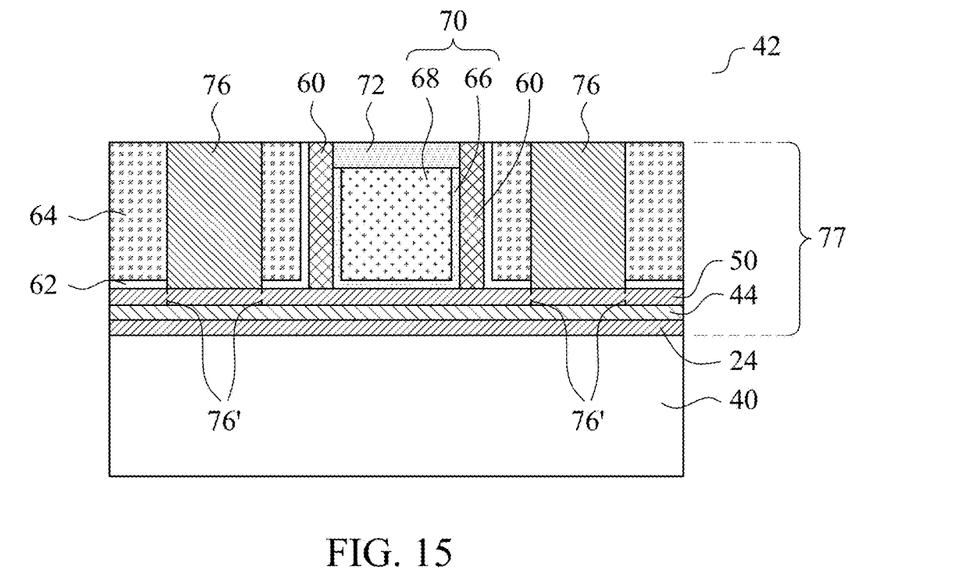

Referring to FIG. 15, source and drain regions (referred to as source/drain regions hereinafter) 76 are formed to penetrate through ILD 64 and ESL 62. The respective process is illustrated as process 230 in the process flow shown in FIG. 18. In accordance with some embodiments, source/drain regions 76 are formed of or comprise a conductive material selected from tungsten, cobalt, palladium (Pd), silver (Ag), nickel(Ni), gold (Au), titanium (Ti), gadolinium (Gd), or alloys thereof. The formation may include etching ILD 64 and ESL 62 (and possibly underlying layers) to form openings, filling a conductive material into the respective openings, and then performing a planarization process such as a Chemical Mechanical Polish (CMP) process or a mechanical grinding process to remove excess portions of the conductive material over ILD 64. The source/drain regions 76 may or may not include a barrier layer formed of titanium, titanium nitride, tantalum, tantalum nitride, or the like.

In accordance with some embodiments, source/drain regions 76 have bottoms landing on, and hence in contact with, the top surface of hBN film 50. Since hBN film 50 is very thin, for example, in the scale of a few nanometers or thinner, carriers may tunnel through hBN film 50 to reach TMD layer 44. Accordingly, although there is hBN film 50 (which is a dielectric layer) between source/drain regions 76 and TMD layer 44, carriers (such as electrons) may flow from source region 76 into the channel region and then into the drain region 76 through tunneling. In accordance with alternative embodiments, source/drain regions 76 may penetrate through ILD 64, ESL 62, and hBN film 50 to be in physical contact with the top surface of TMD layer 44. In accordance with yet alternative embodiments, source/drain regions 76 may penetrate through ILD 64, ESL 62, hBN film 50, and TMD layer 44, so that side contacts are made between the sidewalls of source/drain regions 76 and TMD layer 44. Dashed lines 76' represent the sidewalls of the extended portions of source/drain regions 76 when source/drain regions 76 penetrate through TMD layer 44. Transistor 77 is thus formed.

Figure 16:
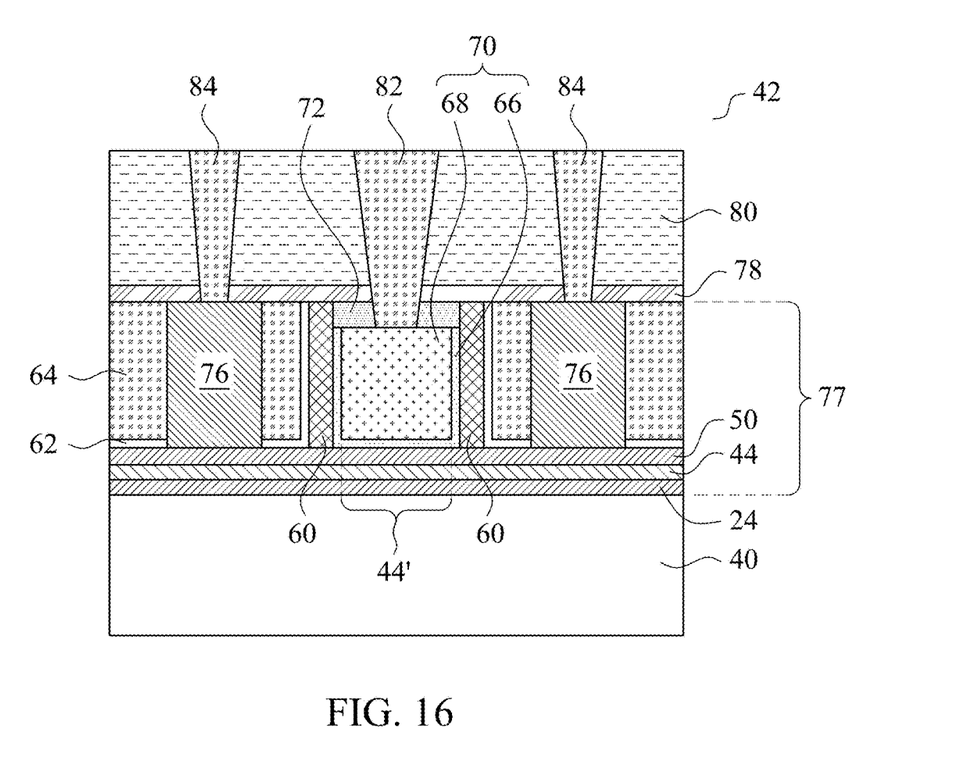

FIG. 16 illustrates the formation of Contact Etch Stop Layer (CESL) 78 over and contacting ILD 64, and ILD 80 over and contacting CESL 78. The respective process is illustrated as process 232 in the process flow shown in FIG. 18. The materials and formation methods of ILD 80 and CESL 78 may be selected from the candidate materials and formation methods of ILD 64 and ESL 62, respectively. Gate contact plug 82 and source/drain contact plugs 84 are formed to electrically connect to gate electrode 68 and source/drain regions 76, respectively. The respective process is illustrated as process 234 in the process flow shown in FIG. 18. In accordance with some embodiments of the present disclosure, gate contact plug 82 and source/drain contact plugs 84 are formed of a conductive material selected from tungsten, aluminum, copper, titanium, tantalum, titanium nitride, tantalum nitride, alloys therefore, and/or multi-layers thereof.

In accordance with some embodiments of the present disclosure, hBN films 24 and 50 are both single-crystalline layers, which sandwich TMD layer 44 therebetween. The portion 44' (of TMD layer 44) directly under gate electrode 68 acts as the channel of transistor 77. The crystalline structures of hBN films 24 and 50 are beneficial for the performance of transistor 77. If hBN films 24 and 50 are polycrystalline layers, there will be grains and boundaries between the grains. The boundaries may result in carrier scattering, and the performance of transistor 77 will be degraded if hBN films 24 and 50 are not single-crystalline layers. If hBN films 24 and 50 are amorphous layers, the scattering will be worse. By pre-forming and transferring single-crystalline hBN films 24 and 50, it is possible to have good single-crystalline structures in both of hBN films 24 and 50. Otherwise, if hBN film 24 is grown on substrate 20, it is difficult to have the single-crystalline structure due to the lattice mismatch. Also, it is difficult to grow single-crystalline hBN film 50 on TMD layer 44.

The embodiments of the present disclosure have some advantageous features. By forming a single-crystalline copper film, a good base structure is formed for growing single-crystalline hBN film thereon. The annealing process on the copper film ensures the single-crystalline structure is formed. The formed single-crystalline hBN layer may be transferred to semiconductor device for forming 2D devices.

Furthermore, the method in accordance with the embodiments of the present disclosure is excellent for forming transistors with multiple TMD layers because the faults in lower layers will not be propagated to the respective upper layers. In addition, the single-crystalline hBN film may be formed at wafer-scale, making the mass production of integrated circuits possible.

In accordance with some embodiments of the present disclosure, a method comprises depositing a copper layer over a first substrate; annealing the copper layer; depositing a hBN film on the copper layer; and removing the hBN film from the copper layer. In an embodiment, the copper layer is deposited to have a polycrystalline structure, and after the annealing, the polycrystalline structure is converted into a single-crystalline structure. In an embodiment, the copper layer is deposited to have a (111) surface plane. In an embodiment, the annealing is performed with the copper layer facing down, and with the first substrate being over the copper layer. In an embodiment, the removing the hBN film from the copper layer comprises forming a protection layer over and contacting the hBN film; forming a thermal release tape on the protection layer; and separating the hBN film from the copper layer. In an embodiment, the method further comprises, after the hBN film is separated from the copper layer, adhering the hBN film to a second substrate. In an embodiment, the method further comprises depositing or transferring a Transition Metal Dichalcogenide (TMD) layer over the hBN film that is on the second substrate; and transferring an additional hBN film over the TMD layer. In an embodiment, the hBN film is separated from the copper layer through electrochemical delamination.

In accordance with some embodiments of the present disclosure, a method comprises forming a single-crystalline copper layer on a first substrate; depositing a first single-crystalline hBN film over the single-crystalline copper layer; transferring the first single-crystalline hBN film onto a substrate; forming a Transition Metal Dichalcogenide (TMD) layer over the hBN film; transferring a second single-crystalline hBN film over the TMD layer; and forming a transistor comprising the TMD layer as a channel. In an embodiment, the forming the transistor comprises forming a source/drain region over and contacting the second single-crystalline hBN film, wherein the source/drain region is physically separated from the TMD layer by the second single-crystalline hBN film. In an embodiment, the forming the transistor comprises forming a source/drain region having a first sidewall contacting a second sidewall of the second single-crystalline hBN film and a third sidewall of the TMD layer. In an embodiment, the depositing the first single-crystalline hBN film is self-stopping, and the single-crystalline hBN film is a mono-layer film. In an embodiment, the forming the single-crystalline copper layer comprises depositing a polycrystalline copper layer; and performing an annealing process to convert the polycrystalline copper layer into the single-crystalline copper layer. In an embodiment, the annealing process is performed at a temperature in a range between about 500° C. and about 1,100° C.

In accordance with some embodiments of the present disclosure, a method comprises depositing a first single-crystalline hBN film over a copper layer; forming a protection layer over and contacting the first single-crystalline hBN film; performing an electrochemical delamination process to separate the first single-crystalline hBN film and the protection layer from the copper layer; adhering the first hBN film and the protection layer to a substrate, with the first hBN film contacting the substrate; and removing the protection layer from the first hBN film. In an embodiment, the copper layer has a thickness in a range between about 400 nm and about 600 nm. In an embodiment, the copper layer has a single-crystalline structure, with the first single-crystalline hBN film being deposited on a (111) surface of the copper layer. In an embodiment, the method further comprises depositing a polycrystalline copper layer; and performing an annealing process to convert the polycrystalline copper layer into the copper layer having a single-crystalline structure. In an embodiment, the annealing process is performed at a temperature in a range between about 500° C. and about 1,100° C. In an embodiment, the single-crystalline hBN film is a mono-layer hBN film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a copper layer over a first substrate, wherein the copper layer is deposited to have a polycrystalline structure;
    annealing the copper layer, wherein after the annealing, the polycrystalline structure is converted into a single-crystalline structure;
    depositing a hexagonal boron nitride (hBN) film on the copper layer; and
    removing the hBN film from the copper layer.

2. The method of claim 1, wherein the copper layer is deposited to have a (iii) surface plane.

3. The method of claim 1, wherein the annealing is performed with the copper layer facing down, and with the first substrate being over the copper layer.

4. The method of claim 1, wherein the removing the hBN film from the copper layer comprises:
    forming a protection layer over and contacting the hBN film;
    forming a thermal release tape on the protection layer; and
    separating the hBN film from the copper layer.

5. The method of claim 4 further comprising, after the hBN film is separated from the copper layer, adhering the hBN film to a second substrate.

6. The method of claim 5 further comprising:
    depositing or transferring a Transition Metal Dichalcogenide (TMD) layer over the hBN film that is on the second substrate; and
    transferring an additional hBN film over the TMD layer.

7. The method of claim 4, wherein the hBN film is separated from the copper layer through electrochemical delamination.

8. The method of claim 1, wherein the depositing the copper layer comprises sputtering copper from a copper target, with the sputtered copper being deposited on the first substrate.

9. The method of claim 1, wherein the annealing the copper layer is performed at a temperature in a range between 500° C. and 1,100° C.

10. A method comprising:
forming a single-crystalline copper layer on a first substrate;
depositing a first single-crystalline hexagonal boron nitride (hBN) film over the single-crystalline copper layer;
transferring the first single-crystalline hBN film onto a second substrate;
forming a Transition Metal Dichalcogenide (TMD) layer over the first single-crystalline hBN film;
transferring a second single-crystalline hBN film over the TMD layer; and
forming a transistor comprising the TMD layer as a channel.

11. The method of claim 9, wherein the forming the transistor comprises:
forming a source/drain region over and contacting the second single-crystalline hBN film, wherein the source/drain region is physically separated from the TMD layer by the second single-crystalline hBN film.

12. The method of claim 9, wherein the forming the transistor comprises:
forming a source/drain region having a first sidewall contacting a second sidewall of the second single-crystalline hBN film and a third sidewall of the TMD layer.

13. The method of claim 9, wherein the depositing the first single-crystalline hBN film is self-stopping, and the first single-crystalline hBN film is a mono-layer film.

14. The method of claim 9, wherein the forming the single-crystalline copper layer comprises:
depositing a polycrystalline copper layer; and
performing an annealing process to convert the polycrystalline copper layer into the single-crystalline copper layer.

15. The method of claim 11, wherein the annealing process is performed at a temperature in a range between 500° C. and 1,100° C.

16. A method comprising:
depositing a first single-crystalline hexagonal boron nitride (hBN) film over a copper layer, wherein the copper layer has a single-crystalline structure, with the first single-crystalline hBN film being deposited on a (iii) surface of the copper layer;
forming a protection layer over and contacting the first single-crystalline hBN film;
performing an electrochemical delamination process to separate the first single-crystalline hBN film and the protection layer from the copper layer;
adhering the first single-crystalline hBN film and the protection layer to a substrate, with the first single-crystalline hBN film contacting the substrate; and
removing the protection layer from the first single-crystalline hBN film.

17. The method of claim 16, wherein the copper layer has a thickness in a range between 400 nm and 600 nm.

18. The method of claim 15 further comprising:
depositing a polycrystalline copper layer; and
performing an annealing process to convert the polycrystalline copper layer into the copper layer having the single-crystalline structure.

19. The method of claim 18, wherein the annealing process is performed at a temperature in a range between 500° C. and 1,100° C.

20. The method of claim 15, wherein the first single-crystalline hBN film is a mono-layer hBN film.

* * * * *

UNITED STATES PATENT AND TRADEMARK OFFICE
CERTIFICATE OF CORRECTION

PATENT NO. : 11,289,582 B2
APPLICATION NO. : 16/594853
DATED : March 29, 2022
INVENTOR(S) : Tse-An Chen et al.

It is certified that error appears in the above-identified patent and that said Letters Patent is hereby corrected as shown below:

In the Claims

Claim 2, Column 12, Line 40; delete "(iii)" and insert --(111)--.

Signed and Sealed this
Seventeenth Day of May, 2022

Katherine Kelly Vidal
*Director of the United States Patent and Trademark Office*